United States Patent
Shirai et al.

(10) Patent No.: US 11,929,301 B2
(45) Date of Patent: Mar. 12, 2024

(54) PACKAGE AND ELECTRONIC DEVICE

(71) Applicants: NGK ELECTRONICS DEVICES, INC., Mine (JP); NGK INSULATORS, LTD., Nagoya (JP)

(72) Inventors: Naoya Shirai, Mine (JP); Yoshikazu Mihara, Shimonoseki (JP); Noriyasu Yamamoto, Sanyo-Onoda (JP)

(73) Assignees: NGK ELECTRONICS DEVICES, INC., Mine (JP); NGK INSULATORS, LTD., Nagoya (JP)

( * ) Notice: Subject to any disclaimer, the term of this patent is extended or adjusted under 35 U.S.C. 154(b) by 100 days.

(21) Appl. No.: 17/700,717

(22) Filed: Mar. 22, 2022

(65) Prior Publication Data

US 2022/0344236 A1    Oct. 27, 2022

(30) Foreign Application Priority Data

Apr. 27, 2021   (JP) .................. 2021-074861

(51) Int. Cl.
*H01L 23/367*    (2006.01)
*H01L 23/373*    (2006.01)

(52) U.S. Cl.
CPC ...... *H01L 23/3675* (2013.01); *H01L 23/3731* (2013.01)

(58) Field of Classification Search
CPC . H01L 21/52; H01L 21/4871; H01L 21/4882; H01L 21/563; H01L 23/02; H01L 23/04; H01L 23/043; H01L 23/053; H01L 23/10; H01L 23/13; H01L 23/29; H01L 23/291; H01L 23/34; H01L 23/36; H01L 23/367; H01L 23/3675; H01L 23/373; H01L 23/3731; H01L 23/3735;
(Continued)

(56) References Cited

U.S. PATENT DOCUMENTS

2007/0246809 A1* 10/2007 Takayama ............... H01L 23/04
257/676
2009/0258248 A1    10/2009 Tsushima
(Continued)

FOREIGN PATENT DOCUMENTS

JP   2001015624 A  *  1/2001
JP   2005-150133 A     6/2005
(Continued)

OTHER PUBLICATIONS

JP2001015624A_English_Translation (Year: 2001).*
(Continued)

*Primary Examiner* — Amir A Jalali
(74) *Attorney, Agent, or Firm* — MATTINGLY & MALUR, PC

(57) ABSTRACT

A package has a cavity to be sealed by a lid. The package includes a heat sink having a coefficient of thermal expansion of 9 ppm/° C. or more and 15 ppm/° C. or less from 25° C. to 100° C. and a frame disposed on the heat sink, made of ceramics, and surrounding the cavity in plan view. An outer edge of the frame includes a first linear portion extending along a first direction, a second linear portion extending along a second direction orthogonal to the first direction, and a chamfer connecting the first linear portion and the second linear portion in plan view.

8 Claims, 12 Drawing Sheets

(58) Field of Classification Search
CPC ......... H01L 23/49541; H01L 23/49562; H01L 23/49579; H01L 23/4962; H01L 23/49838; H01L 23/49844; H05K 7/00; H05K 7/20; H05K 7/2039; H05K 2201/068; H05K 2201/10371
See application file for complete search history.

(56) References Cited

U.S. PATENT DOCUMENTS

| | | | | |
|---|---|---|---|---|
| 2013/0183575 | A1* | 7/2013 | Goto | H01G 11/80 429/163 |
| 2014/0084752 | A1* | 3/2014 | Miyasaka | H03H 9/1021 29/25.35 |
| 2014/0319982 | A1* | 10/2014 | Yamamoto | H05K 1/183 312/223.1 |
| 2017/0026028 | A1* | 1/2017 | Takase | H03H 9/1021 |
| 2020/0294872 | A1* | 9/2020 | Kitawada | H01L 23/047 |

FOREIGN PATENT DOCUMENTS

| | | |
|---|---|---|
| JP | 2007-115731 A | 5/2007 |
| JP | 2009-16649 A | 1/2009 |
| JP | 2010-219441 A | 9/2010 |
| WO | 2013/161660 A1 | 10/2013 |

OTHER PUBLICATIONS

Jnexamined U.S. Appl. No. 17/700,720, filed Mar. 22, 2022.
Japanese Office Action received in corresponding Japanese Application No. 2021-074861 dated Jan. 16, 2024.

* cited by examiner

F I G. 3
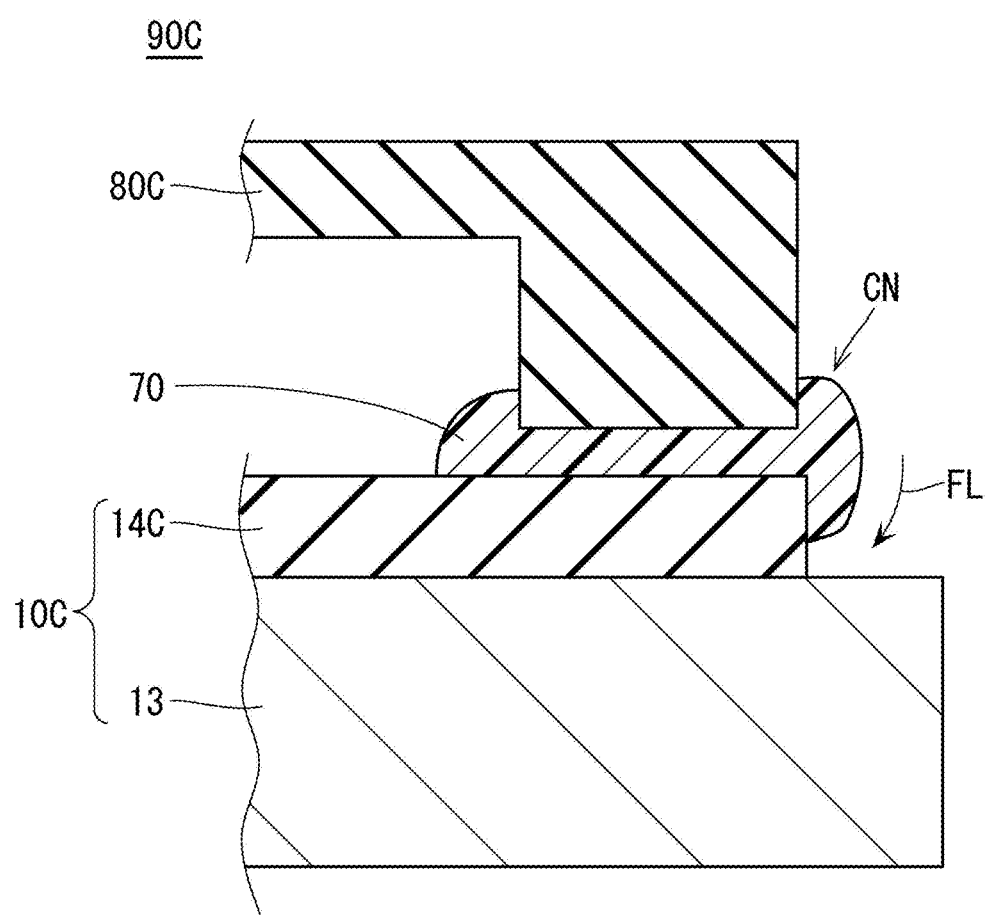

F I G. 4
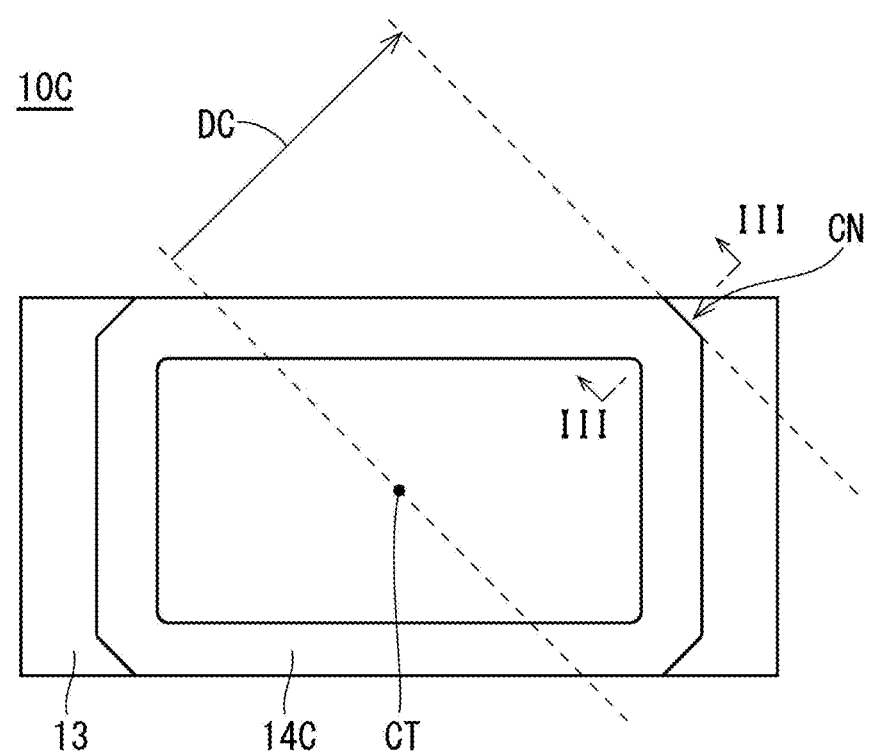

F I G. 6
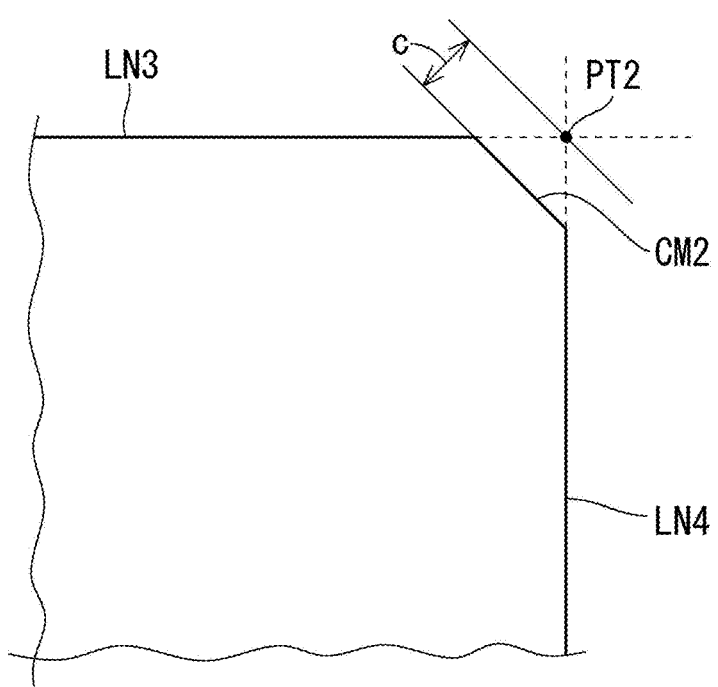

F I G. 8
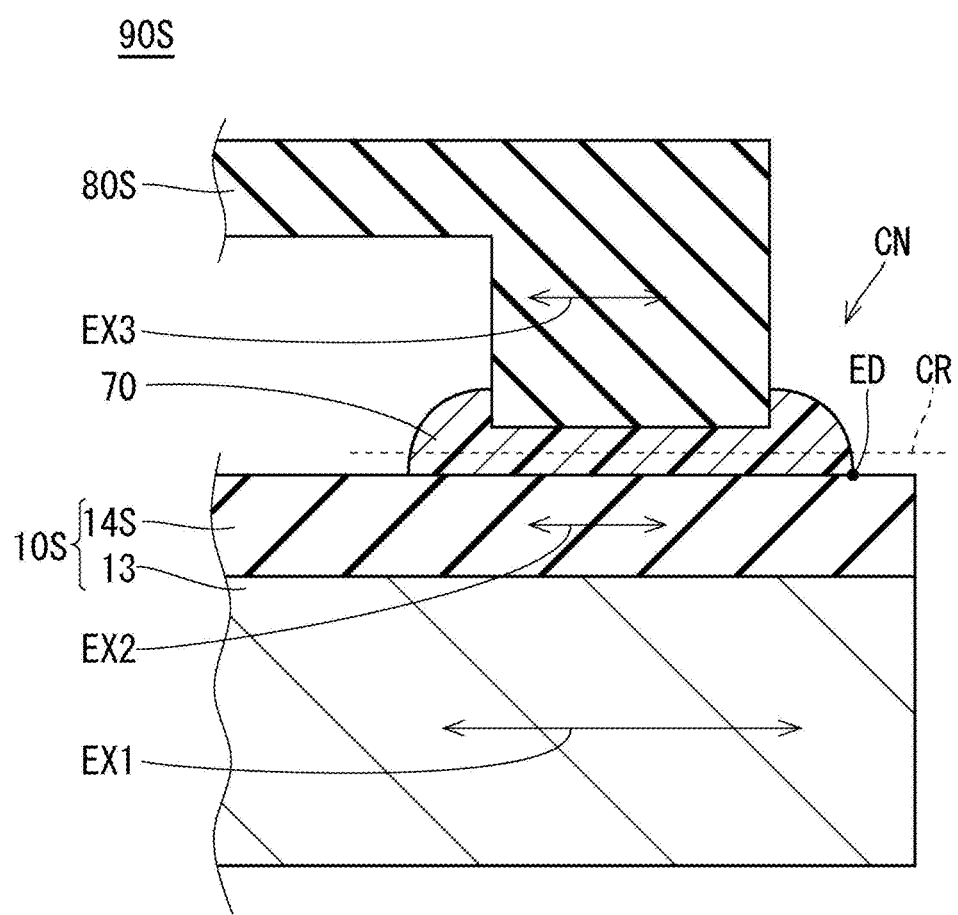

F I G. 1 2
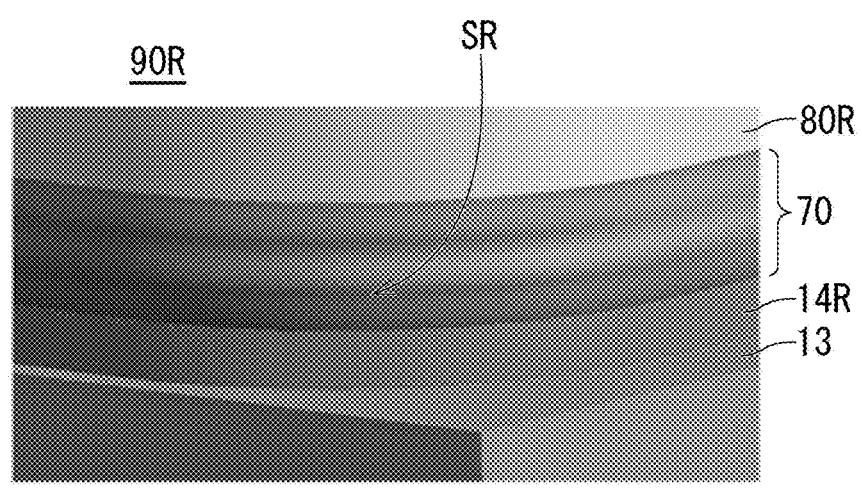

PACKAGE AND ELECTRONIC DEVICE

CROSS-REFERENCE TO RELATED APPLICATION

The present application claims priority from Japanese application JP2021-074861, filed on Apr. 27, 2021, the contents of which is hereby incorporated by reference into this application.

BACKGROUND OF THE INVENTION

Field of the Invention

The present invention relates to packages and electronic devices, and, in particular, to a package including a heat sink and an electronic device including the package.

Description of the Background Art

Japanese Patent Application Laid-Open No. 2005-150133 discloses a semiconductor element storage container. The semiconductor element storage container includes a base (package) and a lid. The package includes a heat sink formed of a metal plate, a ceramic frame, and external connection terminals. A semiconductor element is mounted in a cavity portion formed by the heat sink and the ceramic frame. After the semiconductor element is mounted, the lid is joined to the ceramic frame using a resin adhesive, such as an epoxy resin. The lid joined to the ceramic frame using the resin adhesive covers an upper surface of the cavity portion to hermetically seal a cavity. The heat sink is formed of a composite metal plate of copper (Cu) and other metals. To impart high thermal conductivity to the heat sink, the heat sink may have a coefficient of thermal expansion of 8 ppm/° C. or more at a small sacrifice of approximation of the coefficient of thermal expansion of the heat sink to that of the ceramic frame. Japanese Patent Application Laid-Open No. 2005-150133 asserts that, even when the heat sink has such a high coefficient of thermal expansion, reliability of junction between the package and the lid can be secured as the lid is made of a resin material.

Japanese Patent Application Laid-Open No. 2007-115731 discloses a cladding material (composite metal plate) for a heat dissipating substrate (heat sink). The cladding material includes a stack of a total of five or more alternating copper layers and molybdenum layers. The cladding material can thus have high thermal conductivity close to that of Cu alone while having a coefficient of thermal expansion of 14 ppm/° C. or less. By having high thermal conductivity, the heat sink can have high heat dissipation.

As disclosed in Japanese Patent Application Laid-Open No. 2005-150133, reliability of the junction between the package and the lid is likely to be secured when the lid includes the resin material. According to the study of the inventors, however, it is difficult to secure reliability of the junction when the heat sink has an excessively high coefficient of thermal expansion. When the lid is made of not the resin material but ceramics, it is more difficult to secure reliability of the junction as the lid has a higher rigidity. Description will be made below in this respect. In description below in the present description, a coefficient of thermal expansion (CTE) at a temperature T (° C.) is defined as follows:

$$\{(L_T-L_{25})/(T-25)\}/L_{25},$$

where $L_{25}$ is the length at a temperature of 25° C. (room temperature), and $L_T$ is the length at the temperature T.

In the present description, the above-mentioned coefficient of thermal expansion is also referred to as a coefficient of thermal expansion from 25° C. to T (° C.). The coefficient of thermal expansion of the composite metal plate is calculated based on the length along an in-plane direction. The in-plane direction is herein a direction perpendicular to a direction of the stack (direction of the thickness) of the composite metal plate.

According to the study of the inventors, when the heat sink has a coefficient of thermal expansion of 9 ppm/° C. or more, a resin adhesive layer to join the frame and the lid is likely to be cracked in a heating cycle. The inventors have actually observed such a crack as a result of a heating cycle test at −65° C. to 150° C. When the crack extends between the cavity and external atmosphere, hermeticity of the cavity is lost.

On the other hand, as disclosed in Japanese Patent Application Laid-Open No. 2007-115731, a coefficient of thermal expansion of a material to obtain high thermal conductivity is not necessarily limited to 9 ppm/° C. or less. Under the constraint that the coefficient of thermal expansion is 9 ppm/° C. or less, necessary thermal conductivity cannot be secured in some cases, and, as a result, the heat sink can have insufficient heat dissipation.

SUMMARY

The present invention has been conceived to solve a problem as described above, and it is an object of the present invention to provide a package capable of securing reliability of junction between a frame and a lid while including a heat sink having higher heat dissipation and to provide an electronic device including the package.

A package according to one embodiment has a cavity to be sealed by a lid. The package includes a heat sink having a coefficient of thermal expansion of 9 ppm/° C. or more and 15 ppm/° C. or less from 25° C. to 100° C. and a frame disposed on the heat sink, made of ceramics, and surrounding the cavity in plan view. An outer edge of the frame includes a first linear portion extending along a first direction, a second linear portion extending along a second direction orthogonal to the first direction, and a chamfer connecting the first linear portion and the second linear portion in plan view.

A ratio of a distance b to a distance a is 10% or more and 50% or less, where the distance a is a shortest distance between an imaginary intersection of the first and the second linear portions and an inner edge of the frame, the distance b is a shortest distance between the intersection and the outer edge of the frame in plan view. The lid is made of ceramics.

An electronic device according to one embodiment includes the package, an electronic component disposed within the cavity of the package, and the lid to seal the cavity of the package. An edge of the lid includes a third linear portion extending along the first direction and a fourth linear portion extending along the second direction in plan view. A ratio of a distance c to a distance b is 0% or more and 120% or less, where the distance b is a shortest distance between an imaginary intersection of the first linear portion and the second linear portion and the outer edge of the frame, the distance c is a shortest distance between an imaginary intersection of the third linear portion and the fourth linear portion and the edge of the lid in plan view.

The edge of the lid includes a chamfer connecting the third linear portion and the fourth linear portion. A ratio of the distance c to a distance a is 10% or more and 50% or less, where the distance a is a shortest distance between the imaginary intersection of the first linear portion and the second linear portion and an inner edge of the frame in plan view.

According to one embodiment, a corner connecting the first linear portion and the second linear portion of the outer edge of the frame includes the chamfer. Concentration of stress applied to an adhesive layer near the corner due to a difference in thermal expansion and contraction is thereby reduced. Thus, even if the heat sink has a coefficient of thermal expansion of 9 ppm/° C. or more to have higher heat dissipation, concentration of excessive stress to the adhesive layer can be avoided when the coefficient of thermal expansion is 15 ppm/° C. or less. Reliability of junction between the frame and the lid can thus be secured while causing the heat sink to have higher heat dissipation.

The objects, features, aspects, and advantages of the present invention will become more apparent from the following detailed description and the accompanying drawings.

BRIEF DESCRIPTION OF THE DRAWINGS

FIG. 3 is a schematic cross-sectional view taken along the line III-III of the electronic device of FIG. 1;

FIG. 4 is a plan view schematically showing a configuration of a package of the electronic device according to one embodiment of the present invention, with metal terminals omitted in the figure;

FIG. 6 is a partial plan view schematically showing a configuration of a lid to be attached to the frame of FIG. 5;

FIG. 8 is a partial cross-sectional view illustrating a configuration of an electronic device including the package of FIG. 7 in a similar view to that in FIG. 3;

FIG. 12 is a partial perspective view showing a result of simulation of distribution of stress to an adhesive layer of an electronic device according to a modification.

DESCRIPTION OF THE PREFERRED EMBODIMENTS

An embodiment of the present invention will be described below with reference to the drawings.

Figure 1:
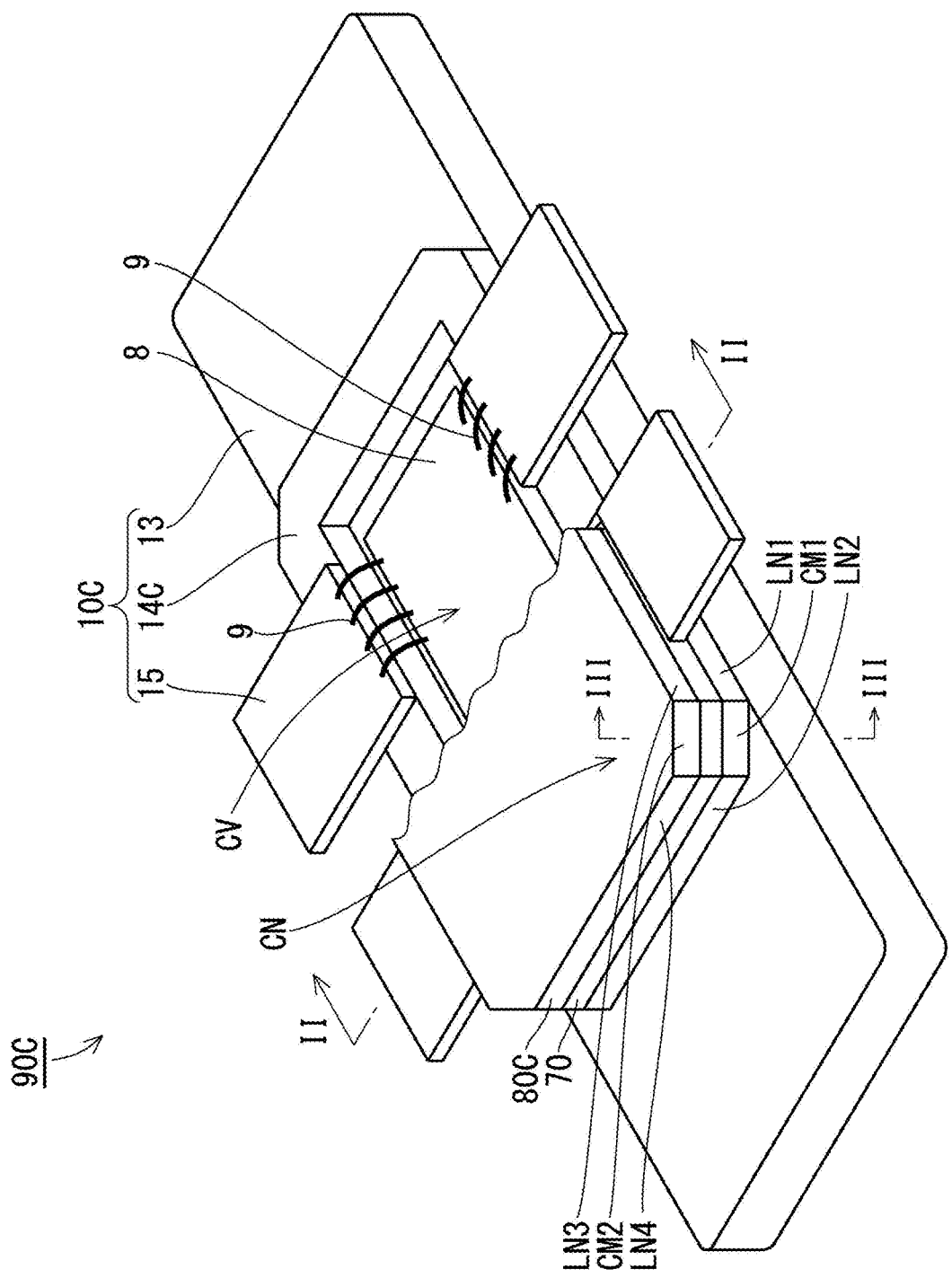
FIG. 1 is a schematic perspective view illustrating a configuration of an electronic device according to one embodiment, with a portion thereof omitted in the figure so that the interior of a cavity is visible.
Figure 2:
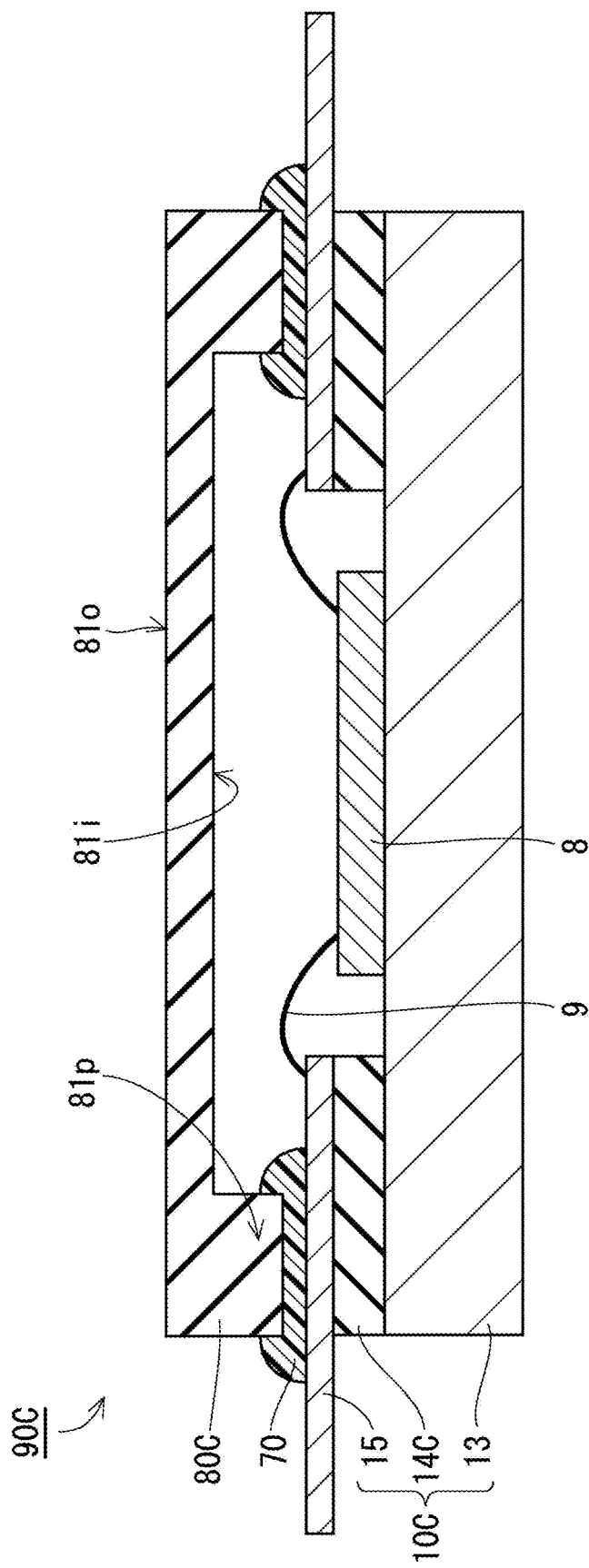
FIG. 2 is a schematic cross-sectional view taken along the line II-II of the electronic device of FIG. 1.

FIG. 1 is a schematic perspective view illustrating a configuration of an electronic device 90C according to the present embodiment, with a portion thereof omitted in the figure so that the interior of a cavity CV is visible. FIGS. 2 and 3 are schematic cross-sectional views respectively taken along the line II-II and the line III-III of the electronic device 90C of FIG. 1.

The electronic device 90C includes a package 10C having the cavity CV, an electronic component 8 disposed within the cavity CV, wires 9, a lid 80C, and an adhesive layer 70. The package 10C includes a heat sink 13, a frame 14C, and metal terminals 15. The electronic component 8 is a high frequency power semiconductor element, for example, and, in this case, the package 10C is a high frequency package. The electronic component 8 may electrically be connected to the metal terminals 15 of the package 10C by the wires 9. The lid 80C is joined to the frame 14C by the adhesive layer 70 to seal the cavity CV.

The lid 8C is made of ceramics. The ceramics may contain alumina as a major component. The ceramics may be the same as or different from those for the frame 14C.

A material for the lid 80C is not limited to the ceramics. For example, the lid 80C may include a resin material. The resin material is a liquid crystal polymer, for example. Inorganic fillers may be dispersed in the resin material, and the inorganic fillers are silica particles, for example. The inorganic fillers dispersed in the resin material can enhance strength and durability of the lid 80C.

The adhesive layer 70 has a portion disposed between the frame 14C and the lid 80C to join them together. The adhesive layer 70 is formed of a thermosetting adhesive in a cured state. The thermosetting adhesive may include at least any of an epoxy resin, a phenolic resin, and a silicone resin as a major component. In particular, the epoxy resin is preferred in terms of a balance of thermal resistance, mechanical strength, and chemical resistance. To suitably have the above-mentioned properties, the thermosetting adhesive in the cured state preferably has a content of the epoxy resin as the major component of 20 wt % to 40 wt % (weight percent), and may include a minor component, such as a curing agent, as the remainder. Specifically, the minor component may be a curing agent of 1 wt % to 10 wt %, inorganic fillers of 50 wt % to 70 wt %, a coupling agent of 0.5 wt % to 2 wt %, a catalyst of 0.5 wt % to 2 wt %, and a low stress agent of 0.1 wt % to 5 wt %, for example. A phenoxy resin compound may be used as the curing agent. Silica may be used as the inorganic fillers. Organic phosphorus or a boron salt may be used as the catalyst. Silicone may be used as the low stress agent. The portion of the adhesive layer 70 disposed between the lid 80C and the package 10C has a thickness of 100 μm or more and 360 μm or less, for example. The adhesive layer 70 may have a smaller flexural modulus than the lid 80C.

In the package 10C, the heat sink 13, the frame 14C, and the metal terminals 15 may be joined together using a joining material (not illustrated). The joining material is silver solder, for example. Metal layers of tungsten, molybdenum, or the like may be disposed on surfaces of the frame 14C joined to the heat sink 13 and the metal terminals 15 to allow for junction between ceramics and metal using silver solder. The package 10C is typically plated after junction using the joining material.

The heat sink 13 is made of metal. The electronic component 8 is mounted on a mounting surface of the heat sink 13 facing the lid 80C. The heat sink 13 has a coefficient of thermal expansion of 9 ppm/° C. or more and 15 ppm/° C. or less from 25° C. to 100° C. Since the heat sink 13 is allowed to have a coefficient of thermal expansion of 9 ppm/° C. or more, it is easy to impart high thermal conductivity to the heat sink 13, and, for example, high thermal conductivity of approximately 330 (W/m·K) or more and 360 (W/m·K) or less can be imparted to the heat sink 13. A value of thermal conductivity may herein be a value at 25° C. On the other hand, since the heat sink 13 has a coefficient of thermal expansion of 15 ppm/° C. or less, an excessive difference in expansion/contraction between the heat sink 13 and the frame 14C can be avoided. The heat sink 13 may be a composite metal plate, and may be a composite metal plate (cladding material) including a stack of alternating Cu plates and Mo (molybdenum) plates, for example. The stack has a five-layer structure of Cu/Mo/Cu/Mo/Cu, for example.

Ceramic particles may be dispersed in metal forming the heat sink 13. The ceramic particles are made of SiC (silicon carbide) or diamond, for example.

The frame 14C is disposed on the heat sink 13, and surrounds the cavity CV in plan view. The frame 14C is made of ceramics. The ceramics contain alumina as a major component, for example. The frame 14C typically has a greater flexural modulus than the adhesive layer 70. The metal terminals 15 are joined to the frame 14C. The metal terminals 15 form an electrical path connecting the interior and the exterior of the cavity CV sealed by the package 10C and the lid 80C. In the cavity CV, the electronic component 8 is electrically connected to the metal terminals 15 by the wires 9. The wires 9 are bonding wires, for example. The adhesive layer 70 is disposed on the package 10C to surround the cavity. Referring to FIG. 1, the adhesive layer 70 may have a portion on the metal terminals 15 and a portion on the frame 14C.

An outer surface (a lower surface in each of FIGS. 1 to 3) of the heat sink 13 of the electronic device 90C is to be attached to a support member (not illustrated). The support member is a mounting board or a heat dissipating member, for example. The heat sink 13 may have a through hole (not illustrated) through which a fastener (e.g., a screw) for attachment to the support member passes.

As illustrated in FIG. 2, the lid 80C has an inner surface 81i facing the cavity and an outer surface 81o opposite the inner surface 81i. A frame portion 81p as a protrusion having a frame shape substantially corresponding to a frame shape of the frame 14C is typically provided on the inner surface 81i. In this case, the adhesive layer 70 is in contact with the frame portion 81p.

Figure 5:
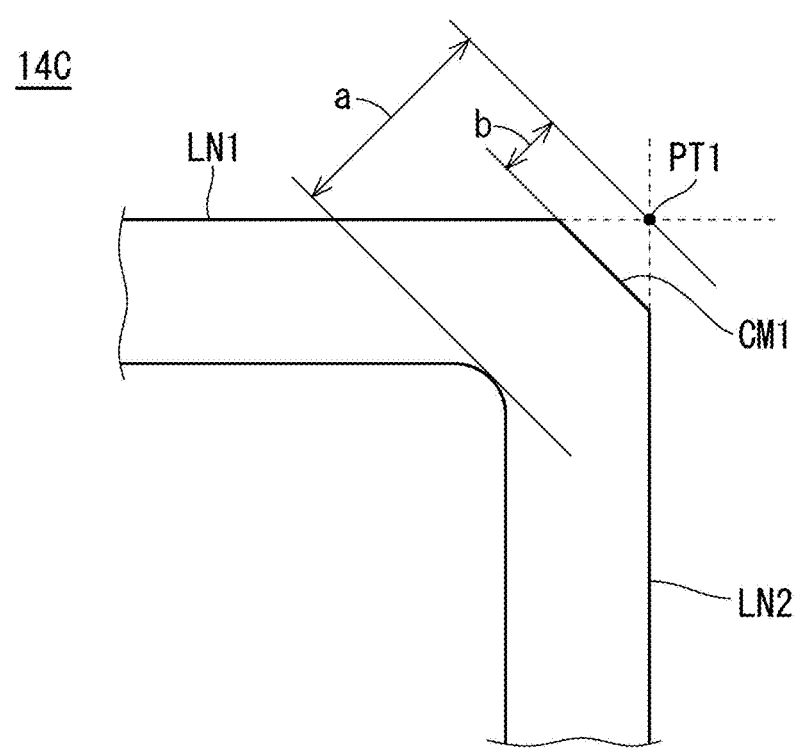
FIG. 5 is a partial plan view schematically showing a configuration of a frame of the package of FIG. 4.

FIG. 4 is a plan view schematically showing a configuration of the package 10C, with the metal terminals 15 (FIGS. 1 and 2) omitted in the figure. FIG. 5 is a partial plan view schematically showing a configuration of the frame 14C of the package 10C (FIG. 4).

An outer edge of the frame 14C includes a linear portion LN1 (first linear portion) extending along a lateral direction (first direction) in FIG. 5, a linear portion LN2 (second linear portion) extending along a longitudinal direction (second direction orthogonal to the first direction) in FIG. 5, and a chamfer CM1 connecting the linear portion LN1 and the linear portion LN2 in plan view.

A ratio of a distance b to a distance a is preferably 10% or more and 50% or less, where the distance a is the shortest distance between an imaginary intersection PT1 (FIG. 5) of the linear portion LN1 and the linear portion LN2 and an inner edge of the frame 14C, the distance b is the shortest distance between the intersection PT1 and the outer edge of the frame 14C in plan view.

In FIG. 5, the chamfer CM1 forms the same angle (45°) with respect to the linear portion LN1 and the linear portion LN2 in plan view. The angle of the chamfer CM1, however, is not limited to 45°. Although the chamfer CM1 that is linear in plan view (see also FIG. 11) is illustrated in each of FIGS. 5 and 6, a chamfer that is curved (typically arcuate) in plan view (see also FIG. 12) may be used instead.

FIG. 6 is a partial plan view schematically showing a configuration of the lid 80C to be attached to the frame 14C (FIG. 5) using the adhesive layer 70 (FIGS. 1 to 3). A lateral direction in FIG. 6 corresponds to the lateral direction in FIG. 5, and a longitudinal direction in FIG. 6 corresponds to the longitudinal direction in FIG. 5.

An edge of the lid 80C includes a linear portion LN3 (third linear portion) extending along the lateral direction (first direction) in FIG. 6 and a linear portion LN4 (fourth linear portion) extending along the longitudinal direction (second direction) in FIG. 6 in plan view. A ratio of a distance c (FIG. 6) to the distance b (FIG. 5) is 0% or more and 120% or less, where the distance c is the shortest distance between an imaginary intersection PT2 of the linear portion LN3 and the linear portion LN4 and the edge of the lid 80C in plan view. When the ratio is 0%, the intersection PT2 is a vertex of the edge of the lid 80C. The linear portion LN1 (FIG. 5) and the linear portion LN3 (FIG. 6) may be substantially colinear in plan view. The linear portion LN2 (FIG. 5) and the linear portion LN4 (FIG. 6) may also be substantially colinear in plan view. The intersection PT1 (FIG. 5) and the intersection PT2 (FIG. 6) may substantially overlap each other in plan view.

The edge of the lid 80C may include a chamfer CM2 connecting the linear portion LN3 and the linear portion LN4. A ratio of the distance c to the distance a (FIG. 5) may be 10% or more and 50% or less. The chamfer CM2 (FIG. 6) may substantially overlap the chamfer CM1 (FIG. 5) in plan view, and, in this case, the chamfer CM2 and the chamfer CM1 have a common shape.

A method of manufacturing the electronic device 90C will be described below.

The package 10C is prepared. The electronic component 8 is mounted on the heat sink 13 of the package 10C. For example, the electronic component 8 is soldered onto the heat sink 13. Next, the electronic component 8 is electrically connected to the metal terminals 15 by the wires 9.

Next, the lid 80C is mounted over the package 10C. Specifically, the lid 80C is attached to the frame 14C of the package 10C through the adhesive layer 70 in a semi-cured state. Next, the lid 80C is pressed against the package 10C at a predetermined load. An appropriate load is dependent on dimensioning of the package 10C, and is 500 g or more and 1 kg or less, for example. The adhesive layer 70 is heated during pressing at the load. The heated adhesive layer 70 changes to a softened state first. The viscosity of the adhesive layer 70 is thus reduced. As a result, the adhesive layer 70 wets. In this case, due to the presence of the chamfer CM1 (FIG. 1), the adhesive layer 70 is likely to flow to cover a side surface of the frame 14C as indicated by an arrow FL (FIG. 3). With the progress of a curing reaction by heating thereafter, the adhesive layer 70 changes to the cured state. As a result, the lid 80C is joined to the package 10C. The cavity CV is thereby sealed.

The electronic device 90C can be obtained as described above.

Figure 7:
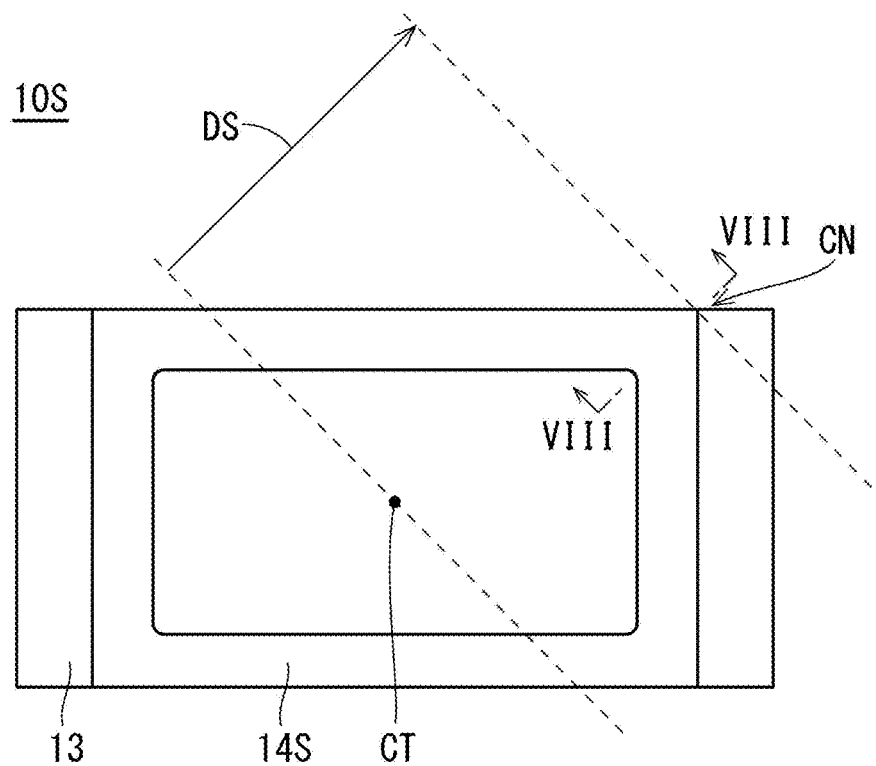
FIG. 7 is a plan view schematically showing a configuration of a package of a comparative example in a similar view to that in FIG. 4, with metal terminals omitted in the figure.

FIG. 7 is a plan view schematically showing a configuration of a package 10S of a comparative example in a similar view to that in FIG. 4, with the metal terminals omitted in the figure. FIG. 8 is a partial cross-sectional view illustrating a configuration of an electronic device 90S including the package 10S (FIG. 7) in a similar view to that in FIG. 3. The package 10S includes a frame 14S not having the chamfer CM1 (FIG. 5). In a heating cycle, expansion/contraction EX1 of the heat sink 13, expansion/contraction EX2 of the frame 14S, and expansion/contraction EX3 of a lid 80S occur as illustrated in FIG. 8.

Figure 9:
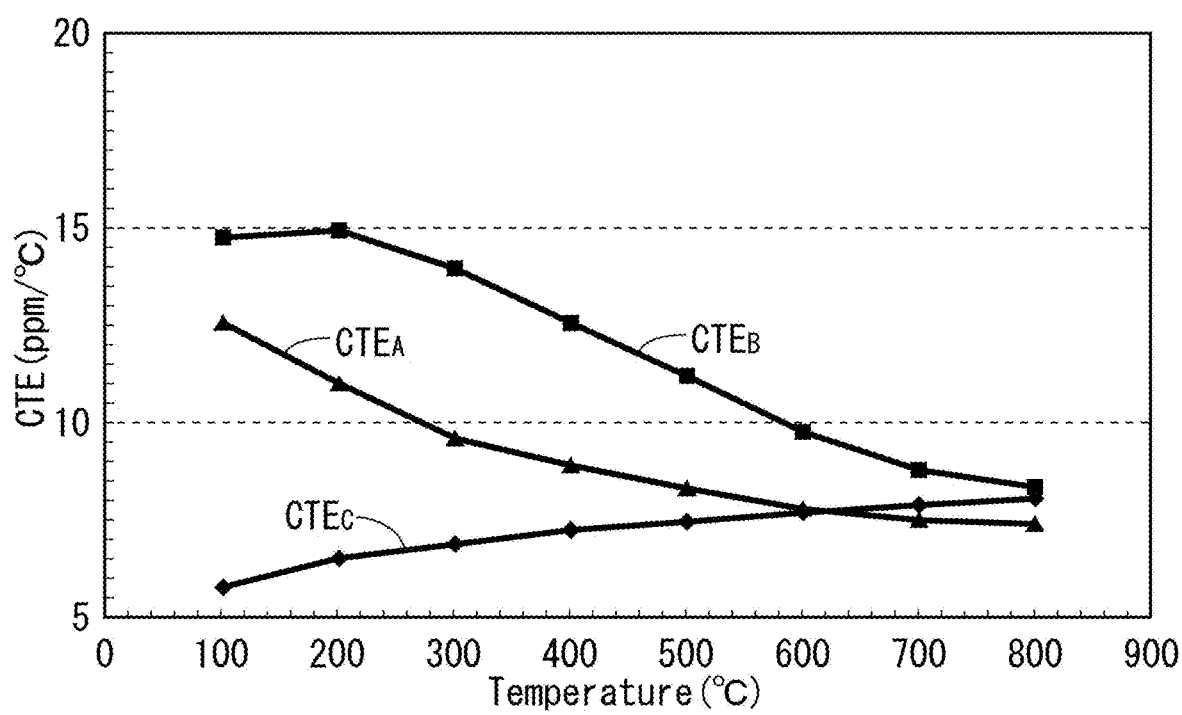
FIG. 9 is a graph showing a coefficient of thermal expansion $CTE_A$ of a composite metal plate (type A) for the heat sink, a coefficient of thermal expansion $CTE_B$ of a composite metal plate (type B) for the heat sink, and a coefficient of thermal expansion $CTE_C$ of a ceramic material for the frame.

FIG. 9 is a graph showing a coefficient of thermal expansion $CTE_A$ of a composite metal plate (type A) for the heat sink, a coefficient of thermal expansion $CTE_B$ of a composite metal plate (type B) for the heat sink, and a coefficient of thermal expansion $CTE_C$ of a typical ceramic material for the frame. The coefficient of thermal expansion of the metal material is measured according to JIS Z 2285, and the coefficient of thermal expansion of the ceramic material is measured according to JIS R 1618. The type A and the type B differ in material design of the composite metal plate. When high thermal conductivity of approximately 330 (W/m•K) or more and 360 (W/m•K) or less is intended, the coefficient of thermal expansion of the composite metal plate is adjustable between the coefficient of thermal expansion $CTE_A$ and the coefficient of thermal expansion $CTE_B$ depending on the material design. Even such adjustment is made, however, the coefficient of thermal expansion of the composite metal plate is much higher than the coefficient of thermal expansion $CTE_C$ of the typical ceramic material for the frame in a temperature range in the heating cycle (−65° C. to +150° C. in a typical test).

Due to the above-mentioned difference in coefficient of thermal expansion, the expansion/contraction EX1 is much greater than the expansion/contraction EX2 as shown in FIG. 8. When the lid 80S is made of ceramics, the expansion/contraction EX1 is greater than the expansion/contraction EX3. Stress is applied to the electronic device 90S due to the difference in expansion/contraction. The stress is likely to be concentrated near a corner CN (FIG. 7) in plan view of the frame 14S, and, as a result, the adhesive layer 70 is likely to have a crack CR (FIG. 8).

In contrast to the frame 14C (FIG. 3), the frame 14S does not have the chamfer CM1 (FIG. 5). The frame 14S thus extends further outward (rightward in FIG. 8) as illustrated in FIG. 8. As a result, the adhesive layer 70 is likely to have an end ED on an upper surface (a surface facing the lid 80S) of the frame 14S. The above-mentioned stress is particularly likely to be concentrated near the end ED, and can be a cause of the crack CR in some cases.

In contrast, according to the present embodiment, due to the presence of the chamfer CM1 (FIG. 1), the adhesive layer 70 is likely to flow to cover the side surface of the frame 14C (FIG. 3: see the arrow FL) as described above. A structure like the end ED (FIG. 8: the comparative example) is thus less likely to be formed. The crack CR (FIG. 8) starting at the end ED can thus be suppressed.

Such an effect obtained when the frame 14C has the chamfer CM1 is obtained regardless of a material for the lid. That is to say, this effect can be obtained also when the lid includes the resin material.

Furthermore, according to the present embodiment, a corner connecting the linear portion LN1 and the linear portion LN2 of the outer edge of the frame 14C (FIG. 5) includes the chamfer CM1. A range DC (FIG. 4) in which a difference in thermal expansion and contraction causing concentration of stress to the corner CN (see FIGS. 1 and 3) is made is thus smaller than a range DS (FIG. 7) in the comparative example. As a result, concentration of stress applied to the adhesive layer 70 near the corner CN due to the difference in thermal expansion and contraction is reduced. Thus, even if the heat sink 13 has a coefficient of thermal expansion of 9 ppm/° C. or more to have higher heat dissipation, concentration of excessive stress to the adhesive layer 70 can be avoided when the coefficient of thermal expansion is 15 ppm/° C. or less. Reliability of junction between the frame 14C and the lid 80C, specifically reliability of junction of the adhesive layer 70 can thus be secured while causing the heat sink 13 to have higher heat dissipation.

When the package is point symmetric about a center CT in plan view as illustrated in FIGS. 4 and 7, stress is concentrated on the corner CN regardless of the material for the lid. The above-mentioned effect obtained when the frame 14C has the chamfer CM1 is thus obtained even when the lid includes the resin material.

Referring to FIGS. 5 and 6, the ratio of the distance c to the distance b of 0% or more and 120% or less helps to avoid the adhesive layer 70 having the end ED (FIG. 8) on the upper surface of the frame 14C at the corner CN. Concentration of stress at the end ED of the adhesive layer 70 can thereby be avoided. Reliability of junction of the adhesive layer 70 in the heating cycle can thus more surely be secured.

The edge of the lid 80C may include the chamfer CM2 (FIG. 6). The edge at the corner of the lid 80C can thus substantially match the outer edge of the frame 14C having the chamfer CM1 (FIG. 5) in plan view. The adhesive layer 70 is thus likely to be disposed appropriately between the frame 14C and the lid 80C at the corner CN (FIG. 1).

Referring to FIG. 5, a result of the study of a relationship among a loss rate (%) as the ratio of the distance b to the distance a, cracking of the adhesive layer 70, and the strength of the frame 14C is shown in a table below.

TABLE 1

| LOSS RATE (%) | 0 | 10 | 20 | 30 | 40 | 50 | 60 | 70 |
|---|---|---|---|---|---|---|---|---|
| CRACKING | C | B | A | A | A | A | A | A |
| FRAME STRENGTH | A | A | A | A | A | B | C | C |

In a row "CRACKING" in the table above, "A" represents a low cracking concern of the adhesive layer 70, "C" represents a high cracking concern, and "B" represents a moderate cracking concern. The loss rate is preferably 10% or more, and is more preferably 20% or more to suppress the cracking concern of the adhesive layer 70.

In a row "FRAME STRENGTH", "A" represents a low strength concern of the frame 14C, "C" represents a high strength concern, and "B" represents a moderate strength concern. The loss rate is preferably 50% or less, and is more preferably 40% or less to suppress the strength concern of the frame 14C. The strength concern refers to concern about handling damage of the frame 14C, for example.

Figure 10:
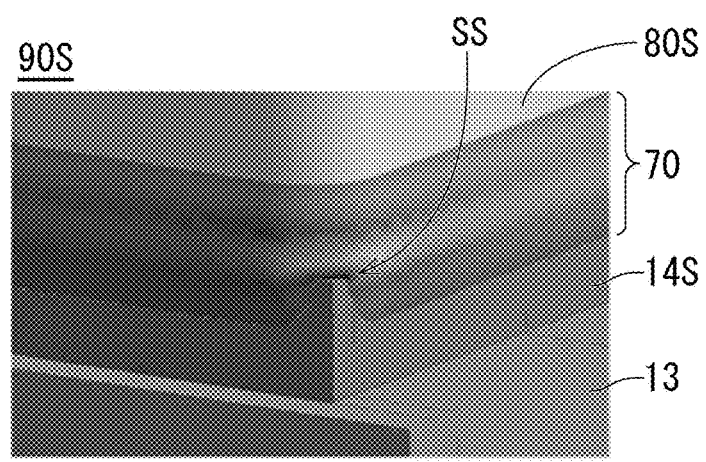
FIG. 10 is a partial perspective view showing a result of simulation of distribution of stress to an adhesive layer of an electronic device of the comparative example.
Figure 11:
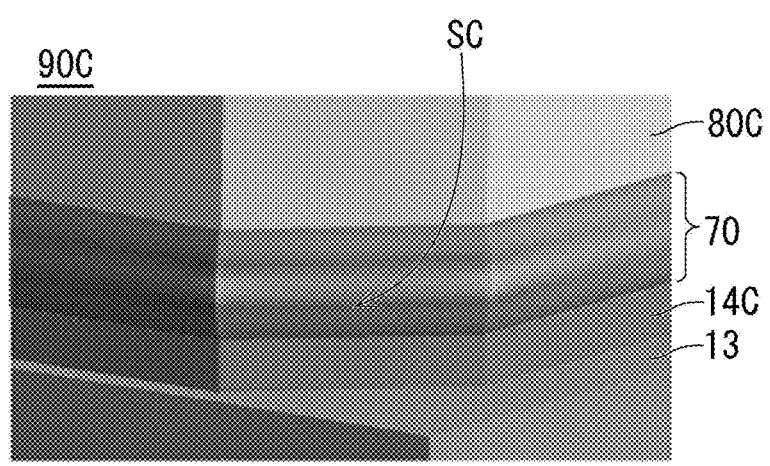
FIG. 11 is a partial perspective view showing a result of simulation of distribution of stress to an adhesive layer of the electronic device according to one embodiment.

FIGS. 10 to 12 are partial perspective views showing results of simulation of distribution of stress to the adhesive layer 70 of the electronic device 90S of the comparative example (see FIGS. 7 and 8), the electronic device 90C corresponding to the embodiment (see FIGS. 1 to 6), and an electronic device 90R according to a modification. The electronic device 90R according to the modification includes a frame 14R and a lid 80R each chamfered to be arcuate. In each of the perspective views, the members are shaded for differentiation among the members and for ease of viewing of the shapes of the members, and, further, shading according to stress is superimposed on the adhesive layer 70. A portion to which higher stress is applied is shaded in darker color (black), and a portion to which lower stress is applied is shaded in lighter color (white).

The electronic device 90S of the comparative example (FIG. 10) has a portion corresponding to the end ED (see FIG. 8), and significant stress concentration SS (FIG. 10) can be seen immediately above the portion. Stress concentration SC in the electronic device 90C corresponding to the embodiment (FIG. 11) is widely distributed linearly in the lateral direction in FIG. 11, and is milder than the stress concentration SS (FIG. 10). Stress concentration SR in the electronic device 90R according to the modification (FIG. 12) is also widely distributed linearly in the lateral direction in FIG. 12, and is milder than the stress concentration SS (FIG. 10). When a stress value of the stress concentration SS (FIG. 10) is defined as 100%, a stress value of the stress concentration SC (FIG. 11) is 68.7%, and a stress value of the stress concentration SR (FIG. 12) is 68.1%.

Conditions for the above-mentioned simulation will be shown below. A coefficient of thermal expansion in Table 2 below is a coefficient of thermal expansion from 25° C. to 100° C. The lid and the frame in Table 2 are each made of ceramics containing alumina as a major component, but slightly differ in minor component of the ceramics. The heat sink in Table 2 is made only of metal.

TABLE 2

| | COEFFICIENT OF THERMAL EXPANSION (ppm/° C.) | YOUNG'S MODULUS (GPa) | POISSON'S RATIO | OUTER DIMENSION: LENGTH × WIDTH × THICKNESS (mm) |
|---|---|---|---|---|
| LID | 5.76 | 340 | 0.21 | 9.4 × 19.8 × 2 |
| ADHESIVE LAYER | 30 | 4 | 0.35 | 9.4 × 19.8 × 0.24 |
| FRAME | 5.76 | 310 | 0.24 | 9.4 × 19.8 × 0.5 |
| HEAT SINK | 12.6 | 130 | 0.30 | 9.8 × 20.6 × 1.026 |

While the invention has been shown and described in detail, the foregoing description is in all aspects illustrative and not restrictive. It is therefore understood that numerous modifications and variations can be devised without departing from the scope of the invention.

What is claimed is:

1. An electronic device comprising a package having a cavity to be sealed by a lid, the package comprising:
    a heat sink having a coefficient of thermal expansion of 9 ppm/° C. or more and 15 ppm/° C. or less from 25° C. to 100° C.; and
    a frame disposed on the heat sink, made of ceramics, and surrounding the cavity in plan view, wherein
    an outer edge of the frame includes a first linear portion extending along a first direction, a second linear portion extending along a second direction orthogonal to the first direction, and a chamfer connecting the first linear portion and the second linear portion in plan view,
    the electronic device further comprising:
    an electronic component disposed within the cavity of the package; and
    the lid sealing the cavity of the package, wherein
    an edge of the lid includes a third linear portion extending along the first direction and a fourth linear portion extending along the second direction in plan view, and
    a ratio of a distance c to a distance b is 0% or more and 120% or less,
    where the distance b is a shortest distance between an imaginary intersection of the first linear portion and the second linear portion and the outer edge of the frame, the distance c is a shortest distance between an imaginary intersection of the third linear portion and the fourth linear portion and the edge of the lid in plan view, wherein
    the lid is separate from the heatsink of the package.

2. The electronic device according to claim 1, wherein a ratio of the distance b to a distance a is 10% or more and 50% or less,
    where the distance a is a shortest distance between an imaginary intersection of the first linear portion and the second linear portion and an inner edge of the frame.

3. The electronic device according to claim 1, wherein the lid is made of ceramics.

4. The electronic device according to claim 1, wherein the edge of the lid includes a chamfer connecting the third linear portion and the fourth linear portion.

5. The electronic device according to claim 4, wherein a ratio of the distance c to a distance a is 10% or more and 50% or less,
    where the distance a is a shortest distance between the imaginary intersection of the first linear portion and the second linear portion and an inner edge of the frame in plan view.

6. An electronic device comprising a package having a cavity to be sealed by a lid, the package comprising:
    a heat sink having a coefficient of thermal expansion of 9 ppm/° C. or more and 15 ppm/° C. or less from 25° C. to 100° C.; and
    a frame disposed on the heat sink, made of ceramics, and surrounding the cavity in plan view, wherein
    an outer edge of the frame includes a first linear portion extending along a first direction, a second linear portion extending along a second direction orthogonal to the first direction, and a chamfer connecting the first linear portion and the second linear portion in plan view,
    the electronic device further comprising:
    an electronic component disposed within the cavity of the package; and
    the lid sealing the cavity of the package, wherein
    an edge of the lid includes a third linear portion extending along the first direction and a fourth linear portion extending along the second direction in plan view, and
    a ratio of a distance c to a distance a is 10% or more and 50% or less,
    where the distance a is a shortest distance between an imaginary intersection of the first linear portion and the second linear portion and an inner edge of the frame in plan view, and the distance c is a shortest distance between an imaginary intersection of the third linear portion and the fourth linear portion and the edge of the lid in plan view.

7. The electronic device according to claim 6, wherein a ratio of a distance b to the distance a is 10% or more and 50% or less, where the distance b is a shortest distance between an imaginary intersection of the first linear portion and the second linear portion and the outer edge of the frame in plan view.

8. The electronic device according to claim 6, wherein the lid is made of ceramics.

* * * * *